STABILIZATION OF THIN FILM TRANSISTORS

Filed May 1, 1967

INVENTORS
MORTON L. TOPFER &
RICHARD E. QUINN
BY
ATTORNEY

United States Patent Office 3,520,051
Patented July 14, 1970

3,520,051

STABILIZATION OF THIN FILM TRANSISTORS

Morton L. Topfer, East Brunswick, and Richard E. Quinn, Willingboro, N.J., assignors to RCA Corporation, a corporation of Delaware Filed May 1, 1967, Ser. No. 634,972
Int. Cl. H01l *11/14*
U.S. Cl. 29—571 5 Claims

ABSTRACT OF THE DISCLOSURE

More stable thin film transistors of the type comprising a layer of a polycrystalline semiconductor such as cadmium sulfide, deposited on an insulating substrate and having closely spaced source and drain electrodes and an insulated gate electrode, are obtained by a heat treatment in which the device to be stabilized is heated at a temperature of preferably 150° C. until the resistance of its semiconductor reaches a level value. The semiconductor resistance is monitored by means of a circuit which supplies a gate voltage to the transistor which is a fixed fraction of its drain voltage.

BACKGROUND OF THE INVENTION

This invention relates to thin film transistors. More particularly, the invention relates to a treatment method for improving the stability of such transistors.

Such thin film transistors are described, for example, in "The TFT, A New Thin Film Tranistor," Paul K. Weimer, Proceedings of the IRE, June 1962, page 1460. These transistors have a layer of polycrystalline semiconductive material, such as cadmium sulfide or tellurium, deposited on an insulating substrate. A pair of closely spaced source and drain electrodes are in ohmic contact with the semiconductive material, and a gate electrode is disposed on the semiconductive material and is separated therefrom by a layer of insulating material. Instabilities of these transistors can be manifested in different kinds of unexpected and uncontrolled changes in their transfer characteristics, that is, in their characteristic curves of drain current vs. gate voltage, measured over a predetermined time intermal.

Thin film transistors have previously been heat treated in attempts to improve their stability. The semiconductors of these transistors are ordinarily deposited from a vapor, as by evaporation or sputtering, and in most cases the semiconductor layers are polycrystalline. Former heat treatments were directed toward an annealing of the semiconductor, to reduce the number of crystallites and subcrystal boundaries for example.

The times and temperatures employed in previous heat treatments have been determined by trial and error. However, the optimum time period and temperature of treatment is not the same for all thin film transistors.

SUMMARY OF THE INVENTION

Improved stabilization is provided for a thin film transistor by heat treating the transistor while the resistance of its semiconductor is monitored until that resistance reaches a constant value. The monitoring may be accomplished by supplying a gate voltage to the transistor which is a fixed fraction of its drain voltage, the latter voltage being arbitrarily selected within the expected range of operating voltages for the transistor. The gate voltage may be chosen to provide the most linear drain current to drain voltage relationship and may be determined empirically.

THE DRAWING

PREFERRED EMBODIMENT

Figure 1:
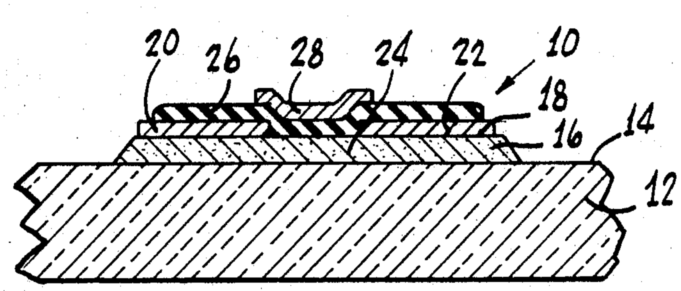
FIG. 1 is a cross section through a representative type of thin film transistor with which the present process is concerned.

A thin film transistor to which the present heat treatment process may be applied is designated by the reference numeral 10 in FIG. 1. The thin film transistor 10 is disposed on a substrate 12 made of an insulating material such as glass, ceramic, fused quartz, or the like, the transistor 10 being disposed on a surface 14 of the substrate 12.

The first layer of the transistor 10 adjacent to the surface 14 of the substrate 12 is a layer of semiconductive material 16 which is typically a polycrystalline substance such as cadminum sulfide, cadmium solenide, or tellurium for example. In contact with the upper surface 18 of the semiconductive layer 16 are two spaced electrodes 20 and 22 which act as the source of and drain for majority carriers when the device is connected into suitable circuitry. The spaced electrodes 20 and 22 define a gap 24 therebetween.

Arranged in contact with the upper surface 18 of the semiconductive layer 16 within the gap 24 is a thin film 26 comprised of a wide band gap insulating material. The film 26 constitutes the gate insulator for the transistor 10. The next layer of the device is a gate electrode 28 which is disposed on the insulating layer 26 and overlies the gap 24.

The transistor 10 operates as a majority carrier device in which current through the semiconductive layer 16 from the source to the drain can be varied or modulated by the application of a suitable potential difference between the gate electrode 28 and the source electrode 20. In particular, when suitable biasing potentials are applied between the drain electrode 22 and the source electrode 20 and between the gate electrode 28 and the source electrode 20, fields are established to promote current flow between the source and the drain and to establish, by a capacitance effect, a predetermined concentration of charge carriers in the region of the semiconductive layer 16 which lies beneath the gate electrode 28.

The semiconductive layer 16 has a characteristic resistance which is a function of its geometrical dimensions, of the material of which it is made, and of the manner in which the material is appled to the substrate 12. The semconductive layer 16 may exhibit changes in its resistance, manifested as changes in drain current, which are not immediately relatable to the ambient temperature or to biasing conditions. These changes are the instabilities with which the present process is concerned. They are the result of various factors and conditions of the semiconductive layer 16, such as its degree of crystalline perfection, the density of surface states, etc.

Figures 2, 3:
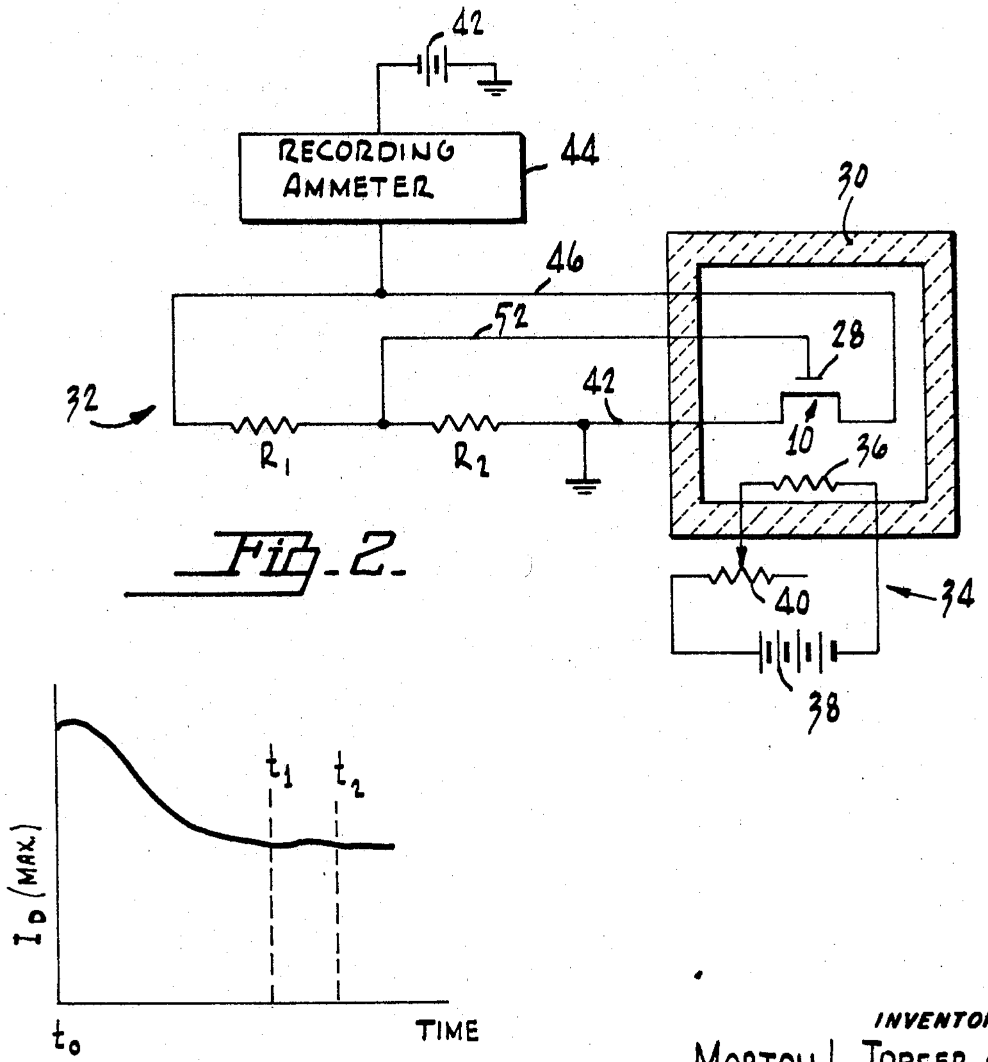
FIG. 2 is a diagrammatic representation of a heat treatment furnace and monitoring circuit.
FIG. 3 is a plot showing the change in the drain current of a typical transistor with time during treatment in accordance with the present process.

FIG. 2 illustrates the heat treatment and monitoring apparatus which may be used to carry out the present process. The transistor 10 is diagrammatically shown in this figure as contained within an oven 30 and connected to a monitoring circuit 32.

Heat is supplied to the interior of the oven 30 by a resistance heating circuit 34 which includes a heating element 36 within the oven 30. A battery 38 and a rheostat 40 provide a predetermined amount of current through the heating element 36 in order to regulate the temperature within the oven 30. The heat applied to the transistor 10 in some way modifies the structure of the semiconductive layer 16 in order to remove or reduce certain of its instabilities.

As has been stated above, thin film transistors have been heat treated in the past, but prior heat treatments have been random. Mere trial and error have been depended on to achieve stability. In the present process, the transistor 10 is heat treated at a constant temperature for a time which is positively determined by the time required for the resistance of the semiconductive layer 16 of that particular transistor to reach a constant value.

The resistance of the semiconductive layer 16 is monitored by the circuit 32 which includes a voltage source represented by the battery 42, a recording ammeter 44, and means for supplying to the transistor 10 a gate voltage which is a fixed fraction of the drain voltage. Thus, the transistor 10 has one of its electrodes connected to the recording ammeter 44 by means of a lead 46 and the other of its electrodes connected to ground by a lead 48. A voltage of −3 volts is typically provided by the battery 42.

The gate of the transistor 10, indicated by reference numeral 28 is connected by means of a lead 52 to a voltage divider represented by the resistances $R_1$ and $R_2$. These resistances are connected in series with each other between the recording ammeter 44 and ground and in parallel with the transistor 10.

The values of the resistances $R_1$ and $R_2$ are chosen to give the most linear drain current to drain voltage relationship in the transistor 10, so that the current measured by the recording ammeter 44 is a valid measure of the resistance of the semiconductive layer 16. Typical values of resistances $R_1$ and $R_2$ have been determined experimentally for one particular type of thin film transistor. This transistor has a vapor deposited semiconductive layer 16 of tellurium, 50 to 75 A. thick. Its source and drain electrodes, 20 and 22, are of deposited gold, typically 250 A. thick, and are so configured and disposed as to define a channel 24 which is 10 microns long (in the direction of current flow) and 0.100 inch wide (in the direction transverse to the current direction). The gate insulator 26 is of silicon monoxide, 250 A. thick; and, the gate electrode 28 is of aluminum, also 250 A. thick. For this transistor, the resistance $R_1$ has a value of 4.3 megohms and the resistance $R_2$ has a value of 6.2 megohms.

The recording ammeter 44 is of conventional construction and provides a record of current on one axis and time on an orthogonal axis. A representation of a typical record taken from the recording ammeter 44 is shown in FIG. 3. It will be observed that between the instants $t_0$ and $t_1$ the current through the ammeter 44 changes substantially from the initial value. At the instant $t_1$, it is not possible to determine whether or not the current through the ammeter, and therefore through the transistor 10, is going to continue to change or not. However, at time $t_2$, which is some arbitrary time later, if the current has not changed, the resistance of the transistor 10 has reached a constant value. The heat treatment of the transistor 10 is then terminated at the time $t_2$.

The temperature range of the heat treatment of the present process as applied to the above-described tellurium transistor, for example, is between about 100 and 200° C. The preferred temperature is the mean between these temperatures that is, 150° C. At this temperature, approximately 12 to 18 hours is usually required to bring the resistance of the transistor to a stable value as explained above. Tests of transistors stabilized in accordance with the present method have shown that a significant improvement in stability has resulted.

We claim:

1. In a process of making a thin film semi-conductive device comprising a layer of semiconductive material supported by an insulating substrate, means defining a pair of spaced ohmic electrodes connected to said semiconductive material and establishing a conductive channel therebetween, and means for establishing an electric field transversely of said channel for controlling the conductivity of said semiconductive material, the steps of:
heating said device while monitoring the resistance of said channel, and
terminating said heating step as soon as the resistance of said channel reaches a constant value.

2. A process as defined in claim 1 wherein said monitoring step is carried out by:
applying a predetermined potential difference across said ohmic contacts,
applying a predetermined biasing potential to said electric field establishing means, and
measuring the resulting current flow through said channel, said heating step being terminated when the current reaches a non-varying value.

3. A process as defined in claim 2 wherein said predetermined biasing potential is a fixed fraction of said potential difference, which fraction provides a linear relationship between the current through said layer of semiconductive material and the potential difference across said ohmic contacts.

4. A process as defined in claim 1 wherein said layer of semiconductive material is tellurium, 50 to 75 A. in thickness, and said heating step is carried out at a temperature between about 100° C. and about 200° C.

5. A process as defined in claim 4 wherein said temperature is about 150° C.

References Cited

UNITED STATES PATENTS

| | | | |
|---|---|---|---|
| 2,725,317 | 11/1955 | Kleimack | 29—585 X |
| 2,874,448 | 2/1959 | Haldeman | 29—574 X |
| 3,258,663 | 6/1966 | Weimer. | |
| 3,298,863 | 1/1967 | McCusker | 29—590 X |
| 3,333,326 | 8/1967 | Thomas et al. | 29—574 |

PAUL M. COHEN, Primary Examiner

U.S. Cl. X.R.

29—574, 5.85, 610, 620